(12) United States Patent
Liu et al.

(10) Patent No.: US 10,579,172 B2
(45) Date of Patent: Mar. 3, 2020

(54) TOUCH DISPLAY PANEL HAVING TWO PRESSURE ELECTRODES, DISPLAY DEVICE AND DRIVE METHOD

(71) Applicant: BOE TECHNOLOGY GROUP CO., LTD., Beijing (CN)

(72) Inventors: Wei Liu, Beijing (CN); Xue Dong, Beijing (CN); Jing LV, Beijing (CN); Haisheng Wang, Beijing (CN); Chun-Wei Wu, Beijing (CN); Xiaoliang Ding, Beijing (CN); Yingming Liu, Beijing (CN); Rui Xu, Beijing (CN); Changfeng Li, Beijing (CN); Pengpeng Wang, Beijing (CN); Lijun Zhao, Beijing (CN); Yanan Jia, Beijing (CN); Yanling Han, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 177 days.

(21) Appl. No.: 15/715,260

(22) Filed: Sep. 26, 2017

(65) Prior Publication Data

US 2018/0088718 A1 Mar. 29, 2018

(30) Foreign Application Priority Data

Sep. 28, 2016 (CN) .......................... 2016 1 0862751

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *G06F 3/0414* (2013.01);
(Continued)

(58) Field of Classification Search
CPC . G06F 2203/04102; G06F 2203/04106; G06F 3/0412
See application file for complete search history.

(56) References Cited

U.S. PATENT DOCUMENTS

| | | | |
|---|---|---|---|
| 2012/0062516 A1* | 3/2012 | Chen ....................... | G06F 3/016 345/174 |
| 2014/0008203 A1* | 1/2014 | Nathan ................ | H03K 17/962 200/600 |

(Continued)

FOREIGN PATENT DOCUMENTS

| | | |
|---|---|---|
| CN | 105183257 A | 12/2015 |
| CN | 205068343 U | 3/2016 |

(Continued)

OTHER PUBLICATIONS

First Office Action for Chinese Patent Application No. 201610862751.3 dated Nov. 5, 2018.

*Primary Examiner* — Chun-Nan Lin
(74) *Attorney, Agent, or Firm* — Calfee, Halter & Griswold LLP

(57) ABSTRACT

The present disclosure provides a touch display panel, a display device, and a drive method. The touch display panel includes a substrate, a plurality of touch sensing electrodes, and a plurality of pressure sensors. The substrate is provided with a light emission side; and a plurality of touch sensing electrodes and a plurality of pressure sensors. The pressure sensors and the touch sensing electrodes are positioned at the light emission side of the substrate. The pressure sensor includes a first pressure electrode and a second pressure electrode. The first pressure electrode is formed on the display panel. The second pressure electrode and the touch sensing electrode jointly form a touch circuit, and the second pressure electrode is used as a drive electrode of the touch circuit.

11 Claims, 4 Drawing Sheets

(52) U.S. Cl.
CPC .. *G06F 3/0416* (2013.01); *G06F 2203/04102* (2013.01); *G06F 2203/04106* (2013.01); *H01L 27/323* (2013.01)

(56) References Cited

U.S. PATENT DOCUMENTS

2016/0188039 A1* 6/2016 Yoon ................. G06F 3/044
 345/174
2017/0003782 A1* 1/2017 Heo .................. G06F 3/044
2017/0308212 A1* 10/2017 Jin .................... G06F 3/0412

FOREIGN PATENT DOCUMENTS

| | | |
|---|---|---|
| CN | 105511683 A | 4/2016 |
| CN | 105528110 A | 4/2016 |
| CN | 105955550 A | 9/2016 |

* cited by examiner

When no pressure is applied

When a pressure is applied

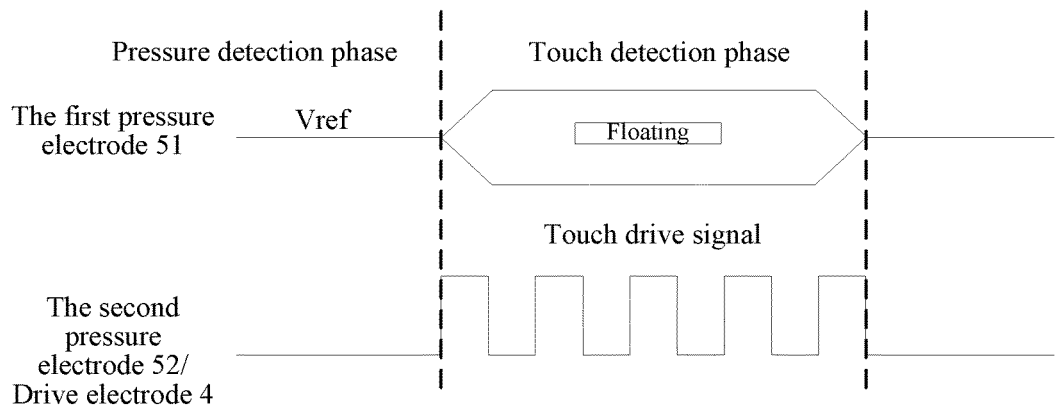

FIG. 6

| S71 |
|---|
| In the pressure detection phase, the control circuit loads a first voltage signal for the first pressure electrode, and determines a pressing position and a magnitude of pressure according to a signal fed back by the second pressure electrode |

| S72 |
|---|
| In the touch detection phase, the control circuit loads a drive control signal for each of the drive electrodes, and determines a touch position according to a signal fed back by the touch sensing electrode |

FIG. 7

TOUCH DISPLAY PANEL HAVING TWO PRESSURE ELECTRODES, DISPLAY DEVICE AND DRIVE METHOD

CROSS REFERENCE

This application is based upon and claims priority to Chinese Patent Application No. 201610862751.3, filed on Sep. 28, 2016, the entire contents thereof are incorporated herein by reference.

TECHNICAL FIELD

The present disclosure relates to the field of touch display technologies, and more particularly, to a touch display panel, a display device, and a drive method.

BACKGROUND

With the development of touch display technologies, particularly with the rapid development of technologies of wearable devices such as smart watches and smart wristbands, higher and higher requirements for display products are brought forward. An existing touch display panel generally adopts an out-cell touch solution, a structure thereof being as shown in FIG. 1, including a substrate 1 and a touch circuit 2. The touch circuit 2 includes a touch sensing electrode 21, a drive electrode 22, an insulating layer 23 arranged between the sensing electrode 21 and the drive electrode 22, and a cover plate 24 arranged on the touch sensing electrode 21. The substrate 1 and the touch circuit 2 are laminated by an adhesive layer 3.

SUMMARY

According to an aspect of the present disclosure, there is provided a touch display panel, including a substrate, a plurality of touch sensing electrodes, and a plurality of pressure sensors. The substrate is provided with a light emission side; and a plurality of touch sensing electrodes and a plurality of pressure sensors. The pressure sensors and the touch sensing electrodes are positioned at the light emission side of the substrate. The pressure sensor includes a first pressure electrode and a second pressure electrode. The first pressure electrode is formed on the substrate. The second pressure electrode and the touch sensing electrode jointly form a touch circuit, and the second pressure electrode is used as a drive electrode of the touch circuit.

According to another aspect of the present disclosure, there is provided a touch display device, including a control circuit and a touch display panel. The touch display panel includes a substrate, a plurality of touch sensing electrodes, and a plurality of pressure sensors. The substrate is provided with a light emission side; and a plurality of touch sensing electrodes and a plurality of pressure sensors. The pressure sensors and the touch sensing electrodes are positioned at the light emission side of the substrate. The pressure sensor includes a first pressure electrode and a second pressure electrode. The first pressure electrode is formed on the substrate. The second pressure electrode and the touch sensing electrode jointly form a touch circuit, and the second pressure electrode is used as a drive electrode of the touch circuit. The control circuit is respectively connected to the first pressure electrode, the second pressure electrode and the touch sensing electrode.

According to another aspect of the present disclosure, there is provided a drive method, used for driving the display device as previously mentioned, and the method includes:

in a pressure detection phase, loading, by a control circuit, a first voltage signal for the first pressure electrode, and determining a pressing position and a magnitude of pressure according to a signal fed back by the second pressure electrode; and in a touch detection phase, loading, by the control circuit, a drive control signal for each of the drive electrodes, and determining a touch position according to a signal fed back by the touch sensing electrode.

BRIEF DESCRIPTION OF THE DRAWINGS

FIG. 6 is a timing diagram of the touch display device in a work process according to an embodiment of the present disclosure; and FIG. 7 is a schematic flowchart of a drive method according to an embodiment of the present disclosure.

Figure 1:
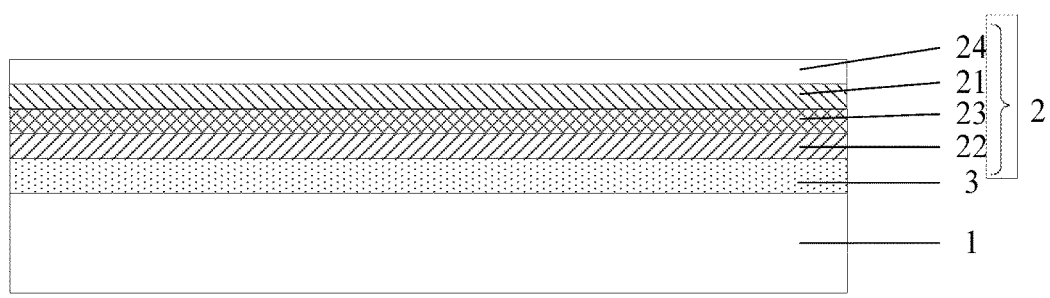
FIG. 1 is a schematic structural diagram of an existing touch display panel.

In the drawings: display panel 1; touch circuit 2; adhesive layer 3; touch sensing electrode 21; drive electrode 22; insulating layer 23; cover plate 24; touch sensing electrode 4; pressure sensor 5; first pressure electrode 51; second pressure electrode 52; piezoelectric material layer 53; polarizer 6; cover plate 7; insulating layer 8; substrate 11; anode layer 12; organic functional layer 13; cathode layer 14; encapsulation film 15; control circuit 9.

DETAILED DESCRIPTION

Technical solutions in the present disclosure will be described clearly and completely below, in conjunction with the accompanying drawings in the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

Specific embodiments of the present disclosure are described in detail below with reference to FIG. 2-FIG. 7.

Figure 2:
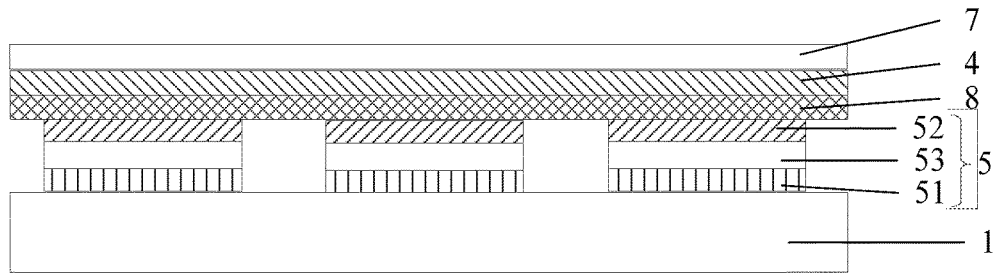
FIG. 2 is a schematic structural diagram of a touch display panel according to a first embodiment of the present disclosure.

As shown in FIG. 2, an embodiment of the present disclosure provides a touch display panel, including a substrate 1, and a plurality of touch sensing electrodes 4 and a plurality of pressure sensors 5 arranged at the same side of the substrate 1.

The pressure sensor 5 includes a first pressure electrode 51 and a second pressure electrode 52. The first pressure electrode 51 is formed on the substrate 1. The second pressure electrode 52 and the touch sensing electrode 4 jointly form a touch circuit, and the second pressure electrode 52 is used as a drive electrode of the touch circuit.

A pressure electrode of the pressure sensor is used as the drive electrode of the touch circuit, so that it is unnecessary to additionally manufacture a drive electrode separately. In this way, touch detection may be implemented, and technological processes of products may be simplified.

According to the present disclosure, the pressure sensor 5 and the touch sensing electrode 4 are arranged on the same side of the substrate 1 and are integrated with the substrate 1. A pressure electrode of the pressure sensor 5 is used as a drive electrode, allowing the drive electrode and the touch sensing electrode 4 to form a touch circuit, so that both the touch detection function and the pressure detection function are integrated into the touch display panel, which may effectively reduce module laminating technology processes of products and save costs. In addition, use of an integrated technology process may effectively reduce the thickness of the touch display panel and meanwhile better implement stress match of each film layer. Therefore, the present disclosure has greater advantage in terms of improving product performance and service life.

As shown in FIG. 2, the touch display panel further includes a cover plate 7. The cover plate 7 is covered at a side, of the touch sensing electrode 4, away from the pressure sensor 5. The pressure sensor 5 and the touch circuit are positioned between the cover plate 7 and the substrate 1. That is, the pressure sensor 5 and the touch circuit are built in the touch display panel.

It is to be noted that, as shown in FIG. 2, the touch display panel may further include an insulating layer 8. The insulating layer 8 is positioned between the touch sensing electrode 4 and the second pressure electrode 52. The second pressure electrode 52 may be used as the drive electrode. Therefore, the touch sensing electrode 4, the insulating layer 8 and the second pressure electrode 52 form the touch circuit to implement the touch detection.

As shown in FIG. 2, the pressure sensor 5 may adopt a piezoelectric sensor. The piezoelectric sensor further includes a piezoelectric material layer 53 positioned between the first pressure electrode 51 and the second pressure electrode 52.

The working principle of the pressure sensor is described below in detail with reference to FIG. 3a and FIG. 3b.

Figure 3A:
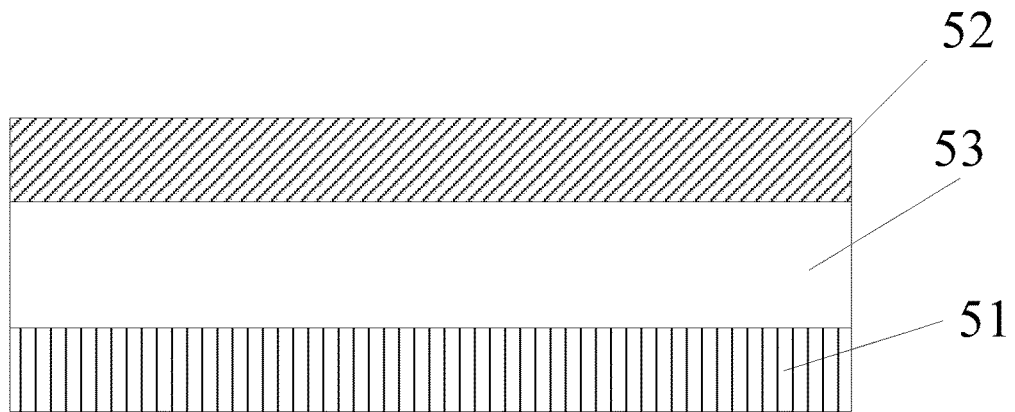
FIG. 3a-FIG. 3b are schematic diagrams showing working principles of a pressure sensor in the touch display panel according to the first embodiment of the present disclosure.
Figure 3B:
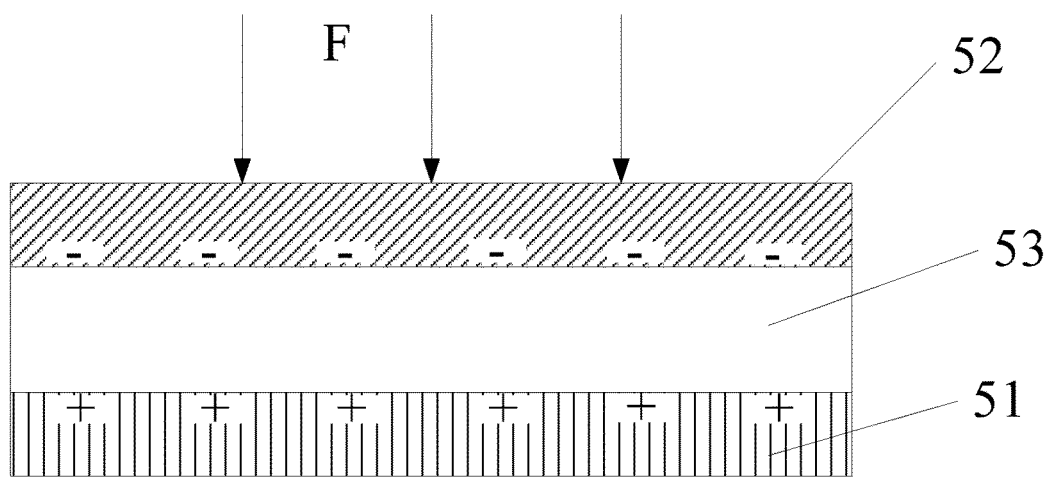

As shown in FIG. 3a, when no external force is applied to the touch display panel, no extra charge is generated on the first pressure electrode 51 and the second pressure electrode 52. As shown in FIG. 3b, when an external force is applied to the touch display panel, under the influence of piezoelectric properties of the piezoelectric material, the piezoelectric material layer 53 generates charges under the action of the external force, so that the positive and negative charges are distributed on the surfaces of the first pressure electrode 51 and the second pressure electrode 52 respectively. The greater the pressure is, the more the generated charges are. Therefore, the determination of a pressing position and a magnitude of pressure can be implemented by detecting the change in the quantity of charges at two sides of each pressure sensor 5 (namely, the first pressure electrode 51 and the second pressure electrode 52).

The pressure sensor 5 is more sensitive to the pressure when the piezoelectric sensor is adopted, which greatly decreases requirements of the touch display panel for overall deformation quantity, so that the service life of the touch display panel may be extended.

It is to be noted that the substrate 1 may be an OLED substrate, an LCD substrate, or an EPD substrate.

As a display device encapsulated and molded using organic materials, the OLED has the advantages of low working voltage, fast response speed, high luminescence efficiency, wide viewing angle, wide working temperature, low power consumption and so on, which is advantageous to light weight and slim design of the display device, especially having a distinct advantage in terms of implementing flexible display. Therefore, when implementing flexible display, generally an OLED display panel is selected. In the embodiments of the present disclosure, reference is made taking an OLED as an example.

Figure 4:
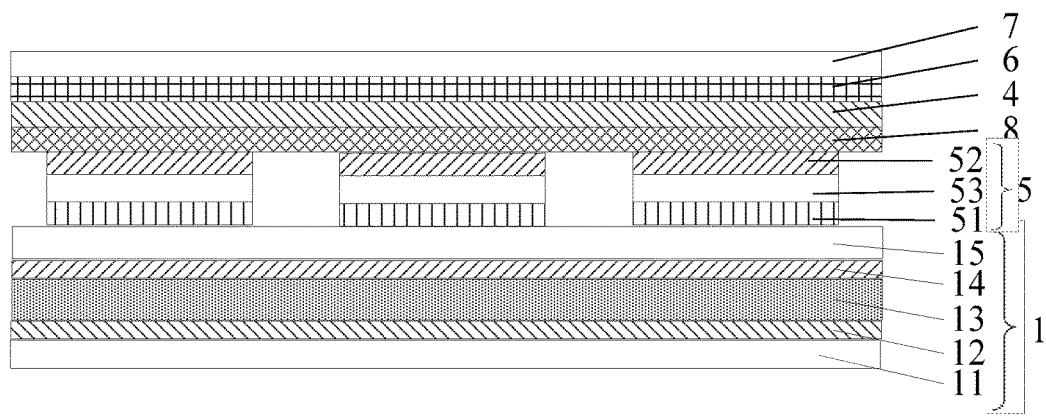
FIG. 4 is a schematic structural diagram of a touch display panel according to a second embodiment of the present disclosure, wherein a substrate is an OLED substrate.

As shown in FIG. 4, the substrate 1 is an OLED display panel, including a substrate 11, an anode layer 12 arranged on the substrate 11, a cathode layer 14, and an organic functional layer 13 arranged between the anode layer 12 and the cathode layer 14. Along a direction facing from the anode layer 12 to the cathode layer 14, the organic functional layer 13 sequentially includes a hole injection layer, a hole transport layer, a light-emitting layer, an electron transport layer, and an electron injection layer. The hole injection layer is adjacent to the anode layer 12, and the electron injection layer is adjacent to the cathode layer 14. At a side, of the cathode layer 14, away from the organic functional layer 13, there is further provided with an encapsulation film (TFE) 15.

When the OLED substrate is selected for the substrate 1, requirements for stress match of each film layer in the display panel and encapsulating materials may be reduced, so that the flexibility performance and service life of the flexible touch display panel may be further improved.

As shown in FIG. 4, the first pressure electrode 51 is formed on the encapsulation film 15 of the OLED display panel.

To reduce light reflection of the OLED display panel and enhance the display effect, as shown in FIG. 4, the touch display panel may further include a polarizer 6, which is formed at a side, of the touch sensing electrode 4, away from the substrate 1. That is, the polarizer 6 is positioned between the cover plate 7 and the touch sensing electrode 4. It is to be noted that the polarizer 6 may be replaced by a color filter, which also can play a role in reducing light reflection of the OLED display panel and enhancing the display effect.

In this embodiment, the pressure sensor 5 and the touch sensing electrode 4 are arranged at a light emission side of the substrate 1 and are integrated with the substrate 1, and a pressure electrode of the pressure sensor 5 is used as a drive electrode, which forms, with the touch sensing electrode 4, a touch circuit. In this way, the touch detection function and the pressure detection function are integrated into the display panel, which may effectively reduce module laminating technology processes of products and save costs. In addition, use of an integrated technology process may effectively reduce the thickness of the touch display panel and meanwhile better implement stress match of each film layer. Therefore, the present disclosure has greater advantage in terms of improving product performance and service life.

Figure 5:
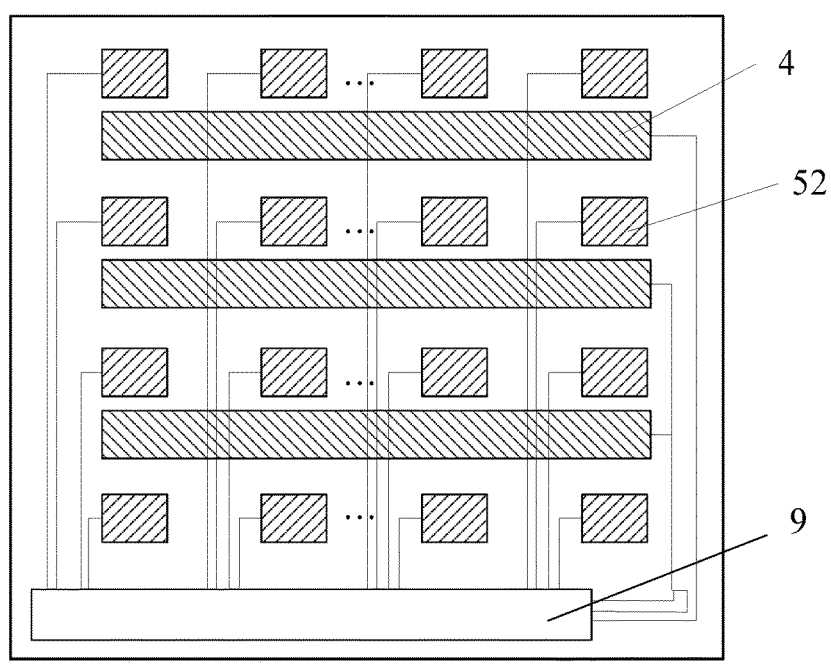
FIG. 5 is a schematic structural diagram of a touch display device according to an embodiment of the present disclosure.

An embodiment of the present disclosure further provides a display device. As shown in FIG. 5, the display device includes a control circuit 9 and a touch display panel. The touch display panel is the touch display panel as previously mentioned, and thus the specific structure thereof is not unnecessarily elaborated herein. The control circuit 9 is respectively connected to the first pressure electrode 51 on the touch substrate 1, the second pressure electrode 52, and the touch sensing electrode 4.

It is to be noted that in the embodiment of the display device of the present disclosure, the touch circuit adopts a mutual capacitive touch circuit to avoid limitation of a self-capacitive touch circuit on capacitors or resistors.

The structure of the touch electrode of the touch circuit of the present disclosure is described in detail with reference to FIG. 5.

As shown in FIG. 5, each of the second pressure electrodes 52 forms a plurality of rows and a plurality of columns of matrixes, and each of the touch sensing electrodes 4 is positioned between each row of the second pressure electrodes 52, or each of the touch sensing electrodes 4 is positioned between each column of the second pressure electrodes 52. The touch sensing electrodes 4 are not consistent with the second pressure electrodes 52 in extension direction to implement the mutual capacitive touch circuit.

To reduce touch detection time, the second pressure electrodes 52 in the same row in the matrix are connected to form a group, serving as a drive electrode. Alternatively, the second pressure electrodes 52 in the same column in the matrix are connected to form a group, serving as a drive electrode. The same drive control signal is applied to the connected second pressure electrodes 52 (namely, the same drive electrode). In this way, the drive control signal may be applied in units of group, and it is unnecessary to apply the drive control signal for each of the drive electrodes one by one, thereby reducing the touch detection time.

In the embodiment as shown in FIG. 5, each of the touch sensing electrodes 4 is positioned between each row of the second pressure electrodes 52. When performing a touch detection, under the control of the control circuit 9, the second pressure electrodes 52 in the same column in the matrix are connected together to form a group, serving as a drive electrode. The control circuit 9 applies the drive control signal to the drive electrode, and may implement the touch detection to determine a touch position according to a sensing signal fed back by the touch sensing electrodes 4.

In other embodiments, each of the touch sensing electrodes 4 may be positioned between each column of the second pressure electrodes 52. In such a case, in a touch detection phase, the control circuit 9 controls the second pressure electrodes 52 in the same row to be connected together to serve as a drive electrode, loads the drive control signal for each of the drive electrodes, and determines the touch position according to a signal fed back by the touch sensing electrode 4.

As shown in FIG. 6, in a pressure detection phase, the control circuit 9 loads a first voltage signal Vref for the first pressure electrode 51, and determines a pressing position and a magnitude of pressure according to a signal fed back by the second pressure electrode 52.

It is to be noted that when it is switched from the pressure detection phase to the touch detection phase, the first voltage signal originally loaded on the first pressure electrode 51 is suspended (that is, loading the first voltage signal is stopped), and the drive control signal is loaded for each group of the second pressure electrodes 52 (namely, each of the drive electrodes).

An embodiment of the present disclosure further provides a drive method, which is used for driving the display device as previously mentioned. As shown in FIG. 7, the method includes following steps:

Step 71: in the pressure detection phase, the control circuit loads a first voltage signal for the first pressure electrode, and determines a pressing position and a magnitude of pressure according to a signal fed back by the second pressure electrode.

Step 72: in the touch detection phase, the control circuit loads a drive control signal for each of the drive electrodes, and determines a touch position according to a signal fed back by the touch sensing electrode.

Specifically, when each of the touch sensing electrodes 4 is positioned between each column of the second pressure electrodes 52, in the touch detection phase, before loading the drive control signal for each of the drive electrodes, the control circuit 9 may control the second pressure electrodes 52 in the same row in the matrix to connect to serve as a drive electrode, thereby reducing the touch detection time.

When each of the touch sensing electrodes 4 is positioned between each row of the second pressure electrodes 52, in the touch detection phase, before loading the drive control signal for each of the drive electrodes, the control circuit 9 may control the second pressure electrodes 52 in the same column in the matrix to connect to serve as a drive electrode.

The present disclosure provides a touch display solution integrating pressure detection and touch detection. Particularly, a piezoelectric pressure detection and mutual-capacitive touch solution is combined with an existing OLED encapsulated structure, a piezoelectric electrode is used as a touch drive electrode, and an additional metal layer is added to fabricate a touch sensing electrode. The pressure detection and the touch detection are implemented by time sharing in timing sequence, and finally the flexible touch display solution characterized by integrated touch detection and pressure detection is implemented. The present disclosure simplifies manufacturing processes of products, reduces module binding and laminating processes, saves fabrication costs, and meanwhile facilitates improving the product experience, thereby ensuring the flexibility performance and service life of the touch display panel.

It is to be understood that the foregoing embodiments are merely exemplary embodiments employed to describe the principle of the present disclosure. However, the present disclosure is not limited thereto. For those of ordinary skill in the art, various modifications and improvements may be made without departing from the spirit and essence of the present disclosure, and these modifications and improvements are also deemed to be within the scope of protection of the present disclosure.

What is claimed is:

1. A touch display panel, comprising:
   a substrate, having a light emission side;
   a plurality of touch sensing electrodes and a plurality of pressure sensors, the pressure sensors and the touch sensing electrodes being positioned at the light emission side of the substrate;
   each pressure sensor of the plurality of pressure sensors comprising:
      a first pressure electrode, formed on the substrate; and
      a second pressure electrode provided on a side of the first pressure electrode away from the substrate, wherein the touch sensing electrodes being positioned on a side of the second pressure electrode away from the substrate, and
      an insulating layer provided between the touch sensing electrode and the second pressure electrode,
         wherein the second pressure electrode and the touch sensing electrode jointly forming a touch circuit, and the second pressure electrode being used as a drive electrode of the touch circuit.

2. The touch display panel according to claim 1, wherein the pressure sensor further comprises:
   a piezoelectric material layer, arranged between the first pressure electrode and the second pressure electrode.

3. The touch display panel according to claim 1, wherein the substrate is an Organic Light Emitting Diode (OLED) substrate, and the first pressure electrode is formed on an encapsulation film of the OLED substrate.

4. The touch display panel according to claim 3, further comprising:
    a polarizer or color a filter, formed at a side of the touch sensing electrode away from the substrate.

5. A display device, comprising:
    a touch display panel, comprising:
        a substrate, having a light emission side; and
        a plurality of touch sensing electrodes and a plurality of pressure sensors, the pressure sensors and the touch sensing electrodes being positioned at the light emission side of the substrate;
            each pressure sensor of the plurality of pressure sensors comprising:
                a first pressure electrode, formed on the substrate;
        a second pressure electrode provided on a side of the first pressure electrode away from the substrate, wherein the touch sensing electrodes being positioned on a side of the second pressure electrode away from the substrate, and
        an insulating layer provided between the touch sensing electrode and the second pressure electrode,
            wherein the second pressure electrode and the touch sensing electrode jointly forming a touch circuit, and the second pressure electrode being used as a drive electrode of the touch circuit; and
    a control circuit, respectively connected to the first pressure electrode, the second pressure electrode and the touch sensing electrode.

6. The display device according to claim 5, wherein each of the second pressure electrodes forms a plurality of rows and a plurality of columns of matrixes, and each of the touch sensing electrodes is positioned between each row of the second pressure electrodes, or each of the touch sensing electrodes is positioned between each column of the second pressure electrodes.

7. The display device according to claim 6, wherein when each of the touch sensing electrodes is positioned between each column of the second pressure electrodes, in a touch detection phase, the control circuit is configured to control the second pressure electrodes in the same row to connect to serve as a drive electrode, load a drive control signal for each drive electrode, and determine a touch position according to a signal fed back by the touch sensing electrode; and when each of the touch sensing electrodes is positioned between each row of the second pressure electrodes, in a touch detection phase, the control circuit is configured to control the second pressure electrodes in the same column to connect to serve as a drive electrode, load a drive control signal for each drive electrode, and determine a touch position according to a signal fed back by the touch sensing electrode.

8. The display device according to claim 5, wherein in a pressure detection phase, the control circuit is configured to load a first voltage signal for each first pressure electrode, and determine a pressing position and a magnitude of pressure according to a signal fed back by the second pressure electrode.

9. The display device according to claim 5, wherein the pressure sensor further comprises:
    a piezoelectric material layer, arranged between the first pressure electrode and the second pressure electrode.

10. The display device according to claim 5, wherein the substrate is an OLED substrate, and the first pressure electrode is formed on an encapsulation film of the OLED substrate.

11. The display device according to claim 10, further comprising:
    a polarizer or a color filter, formed at a side, of the touch sensing electrode, away from the substrate.

* * * * *